US008228143B2

(12) United States Patent
Takano

(10) Patent No.: US 8,228,143 B2
(45) Date of Patent: Jul. 24, 2012

(54) ASSEMBLY OF ELECTROMAGNETIC RELAY AND CIRCUIT BOARD

(75) Inventor: Satoshi Takano, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 12/588,955

(22) Filed: Nov. 3, 2009

(65) Prior Publication Data

US 2010/0109821 A1 May 6, 2010

(30) Foreign Application Priority Data

Nov. 4, 2008 (JP) ................................. 2008-283336

(51) Int. Cl.
*H01H 51/22* (2006.01)
(52) U.S. Cl. ................ 335/78; 335/83; 335/84; 335/85; 335/86; 335/202
(58) Field of Classification Search .............. 335/78–86, 335/202; 324/158 F, 158 P; 361/773, 776, 361/807, 808, 809; 439/483, 912, 912.1
See application file for complete search history.

(56) References Cited

U.S. PATENT DOCUMENTS

| | | | | |
|---|---|---|---|---|
| 2,999,916 A | * | 9/1961 | Huetten et al. .................. | 335/82 |
| 3,142,784 A | * | 7/1964 | Bloomfield ...................... | 335/78 |
| 3,621,112 A | * | 11/1971 | Stickley et al. ............ | 174/50.52 |
| 3,735,294 A | * | 5/1973 | Altmann ........................ | 335/134 |
| 4,626,812 A | * | 12/1986 | Nakanishi et al. ............. | 335/132 |
| 4,899,257 A | * | 2/1990 | Yamamoto ..................... | 361/740 |
| 5,343,365 A | * | 8/1994 | Lueneburger .................. | 361/773 |
| 5,922,989 A | * | 7/1999 | Tsunoda et al. ............... | 174/559 |
| 6,430,054 B1 | * | 8/2002 | Iwata ............................. | 361/752 |
| 2003/0109170 A1 | * | 6/2003 | Ashiya et al. .................. | 439/474 |
| 2006/0139857 A1 | * | 6/2006 | Tsuji .............................. | 361/601 |
| 2007/0049070 A1 | * | 3/2007 | Fujimaki ...................... | 439/76.2 |
| 2008/0220665 A1 | * | 9/2008 | Darr et al. ..................... | 439/842 |
| 2010/0039196 A1 | * | 2/2010 | Yokoyama et al. ........... | 335/202 |

FOREIGN PATENT DOCUMENTS

JP 2002-184286 6/2002

* cited by examiner

*Primary Examiner* — Mohamad Musleh
(74) *Attorney, Agent, or Firm* — Staas & Halsey LLP

(57) ABSTRACT

An assembly including an electromagnetic relay and a circuit board. The electromagnetic relay includes a body having a lateral surface and a bottom surface, and a plurality of terminals protruding outward from the lateral surface of the body. The terminals respectively have distal portions extending beyond the bottom surface of the body. The circuit board is provided with a relay-mount surface. The electromagnetic relay is mounted on the relay-mount surface in an orientation such that the bottom surface of the body is opposed to the relay-mount surface, and the distal portions of the terminals being fixed to the circuit board. Each terminal is formed from a flat plate element and has a shape angled in a width direction of the flat plate element. The body has a height defined in a direction orthogonal to the relay-mount surface of the circuit board and corresponding to a length of a shortest edge of the lateral surface, the shortest edge being shorter than any of edges of the bottom surface.

5 Claims, 2 Drawing Sheets

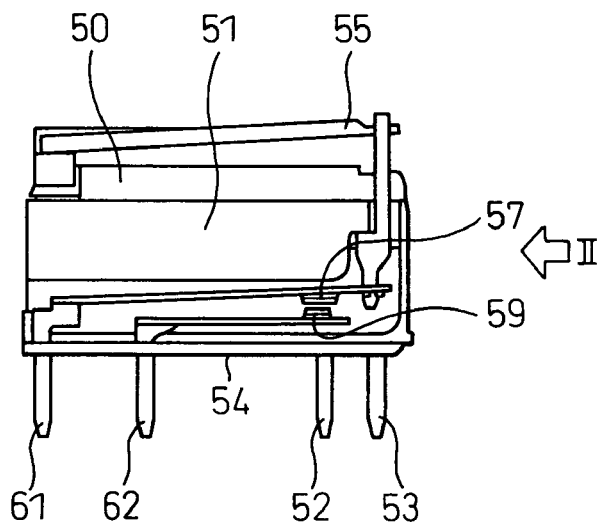
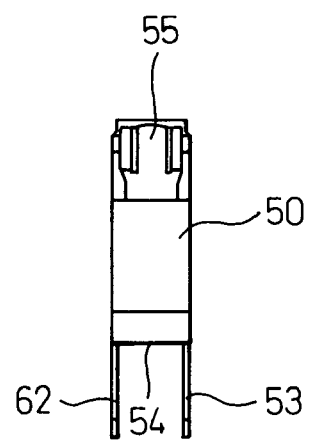
Fig.2A PRIOR ART
Fig.2B PRIOR ART
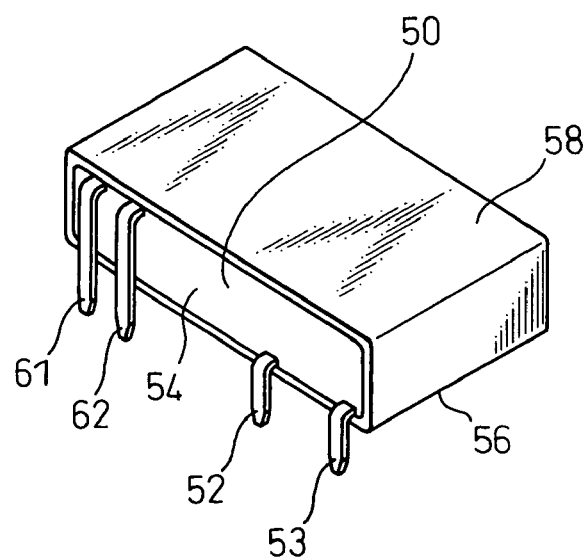
Fig.3 PRIOR ART

ASSEMBLY OF ELECTROMAGNETIC RELAY AND CIRCUIT BOARD

CROSS-REFERENCE TO RELATED APPLICATIONS

This application is based upon and claims the benefit of priority from prior Japanese Patent Application No. 2008-283336 filed on Nov. 4, 2008, the entire contents of which are incorporated herein by reference.

BACKGROUND OF THE INVENTION

1. Field of the Invention

The present invention generally relates to an electronic component, and more particularly to an assembly including an electromagnetic relay and a circuit board on which the electromagnetic relay is mounted.

2. Description of the Related Art

FIGS. 2A and 2B show an example of a conventional electromagnetic relay, wherein FIG. 2A is a front view and FIG. 2B is a side view as seen from arrow II of FIG. 2A. The illustrated conventional electromagnetic relay includes a holder 50 usually formed as a molded member and various components held on the holder 50. The conventional electromagnetic relay typically includes a cover (not shown) attached to the holder 50 so as to enclose the holder 50 and the various components, but FIGS. 2A and 2B illustrates a state where the cover is removed.

The illustrated conventional electromagnetic relay includes a coil (not shown) held in a coil housing section 51 of the holder 50 and coil terminals 52, 53 connected respectively to the wire ends of the coil. The electromagnetic relay further includes a movable contact 57 and a stationary contact 59. The movable contact 57 is capable of being mechanically displaced via a driving mechanism 55 by magnetic force generated by the coil. The stationary contact 59 is capable of being switched between a contact state and a noncontact state with respect to the movable contact 57 due to the displacement of the movable contact 57 under the excitation of the coil. The movable contact 57 and the stationary contact 59 are respectively attached to the first ends of contact members, and terminals 61 and 62 for external connection are respectively formed at the second ends of the contact members.

Typically, it is necessary that the coil has a certain length to generate sufficient magnetic force, and that a desired distance is ensured between the movable contact 57 and the stationary contact 59 in the noncontact state for reliable electrical disconnection, and thereby the electromagnetic relay tends to increase in dimensions. In the example shown in FIGS. 2A and 2B, the electromagnetic relay has a substantially rectangular parallelepiped body and the dimensions thereof are considerably large, particularly in upward/downward and rightward/leftward directions in FIG. 2A.

In the electromagnetic relay of FIGS. 2A and 2B, the terminals 52, 53, 61 and 62 for external connection protrude straight from and extend perpendicularly to a bottom surface 54 of the body, which has a relatively small area. According to this arrangement, the electromagnetic relay of FIGS. 2A and 2B can be mounted on a circuit board (not shown) in an orientation such that the bottom surface 54 having the relatively small area is opposed to the surface of the circuit board, and as a result, an area used for mounting the electromagnetic relay in the surface of the circuit board can be reduced.

On the other hand, depending on the configuration of an apparatus in which the electromagnetic relay is installed, it may be necessary to reduce the height of the electromagnetic relay defined in a direction orthogonal to the surface of the circuit board, i.e., to configure the electromagnetic relay to have a low-profile shape. In this case, as shown in FIG. 3, an alternative arrangement is conventionally used, in which the terminals 52, 53, 61, 62 for external connection are bent at right angles in a thickness direction of the plate-like materials thereof so as to extend parallel to the bottom surface 54. In this alternative arrangement, the terminals 52, 53, 61, 62 are provided respectively with distal portions extending beyond a lateral surface 56 of the rectangular parallelepiped body, the lateral surface 56 intersecting perpendicularly with the bottom surface 54, and thus the electromagnetic relay can be mounted on the circuit board in an orientation such that the lateral surface 56 is opposed to the surface of the circuit board. In this connection, FIG. 3 shows a cover 58 attached to the holder 50 to define the rectangular parallelepiped body.

As another countermeasure, Japanese Unexamined Patent Publication (Kokai) No. 2002-184286 (JP2002-184286A) describes an electromagnetic relay capable of being connected to an external terminal without requiring a large space in a height direction. The electromagnetic relay of JP2002-184286A includes a rectangular parallelepiped body having mutually opposite first and second lateral surfaces and a bottom surface, and a plurality of L-shaped terminals protruding outward from the bottom surface of the body, in which some terminals have distal portions extending beyond the first lateral surface and remaining terminals have distal portions extending beyond the second lateral surface. The electromagnetic relay can be mounted on a circuit board in an orientation such that the bottom surface of the body, from which the terminals protrude, is opposed to the surface of the circuit board, and in this orientation, the distal portions of the terminals can be connected to the external terminals provided on the circuit board, so that the overall height of the electromagnetic relay mounted on the circuit board can be reduced.

SUMMARY OF THE INVENTION

It is an object of the present invention to provide an assembly including an electromagnetic relay and a circuit board, which can reduce an overall height of the electromagnetic relay mounted on the circuit board by a more simple and reasonable configuration.

The present invention provides an assembly comprising an electromagnetic relay including a body having a lateral surface and a bottom surface, and a plurality of terminals protruding outward from the lateral surface of the body, the plurality of terminals respectively having distal portions extending beyond the bottom surface of the body; and a circuit board provided with a relay-mount surface, the electromagnetic relay being mounted on the relay-mount surface in an orientation such that the bottom surface of the body is opposed to the relay-mount surface, and the distal portions of the plurality of terminals being fixed to the circuit board; wherein each of the plurality of terminals is formed from a flat plate element and has a shape angled in a width direction of the flat plate element; and wherein the body has a height defined in a direction orthogonal to the relay-mount surface of the circuit board and corresponding to a length of a shortest edge of the lateral surface, the shortest edge being shorter than any of edges of the bottom surface.

According to the above configuration, a low-profile electromagnetic relay having the simple and reasonable configuration can be provided.

BRIEF DESCRIPTION OF THE DRAWINGS

The above and other objects, features and advantages of the present invention will become more apparent from the following description of the preferred embodiments in connection with the accompanying drawings, wherein:

FIG. 2A is a front view schematically showing an example of a conventional electromagnetic relay, with a cover thereof being removed;

FIG. 2B is a side view schematically showing the electromagnetic relay of FIG. 2A; and FIG. 3 is a perspective view schematically showing the electromagnetic relay of FIG. 2A modified into a low-profile configuration.

DESCRIPTION OF THE PREFERRED EMBODIMENT

Figure 1A:
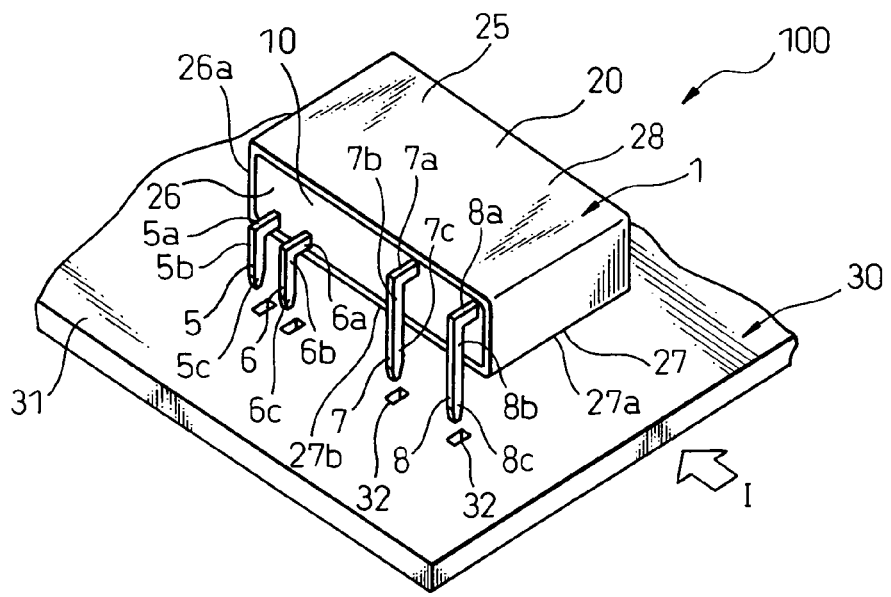
FIG. 1A is a perspective view showing an assembly including an electromagnetic relay and a circuit board, according to an embodiment of the present invention, before the electromagnetic relay is mounted on the circuit board.

The embodiments of the present invention are described below, in detail, with reference to the accompanying drawings. In the drawings, the same or similar components are denoted by common reference numerals.

Figure 1B:
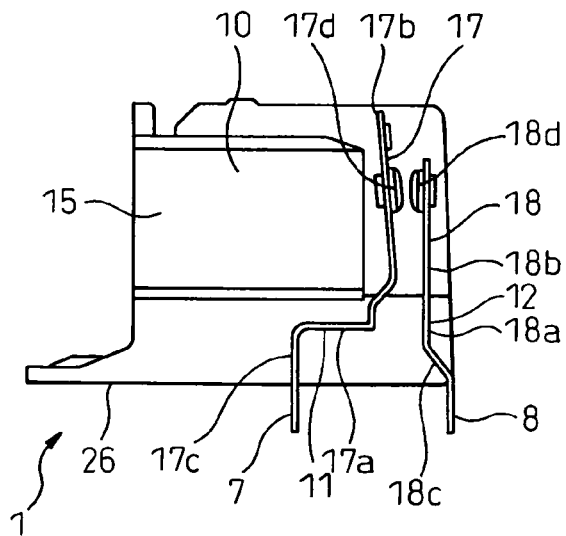
FIG. 1B is a plan view schematically showing several components of the electromagnetic relay of FIG. 1A as seen from an arrow I.
Figure 1C:
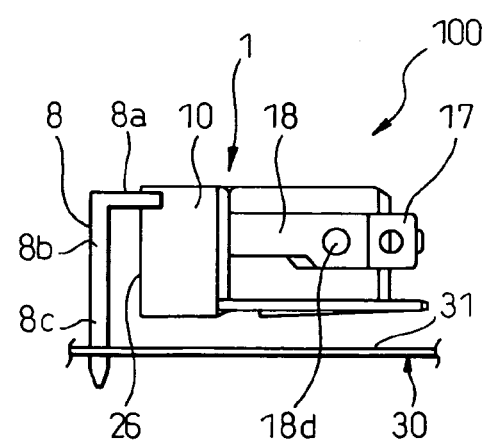
FIG. 1C is a side view schematically showing the assembly of FIG. 1A, in which the electromagnetic relay is mounted on the circuit board.

Referring to the drawings, FIGS. 1A and 1C schematically show an assembly 100 including an electromagnetic relay 1 and a circuit board 30, according to an embodiment of the present invention, in a perspective view and a side view, respectively, and FIG. 1B schematically shows the several components of the electromagnetic relay 1 in a plan view. In this connection, FIGS. 1B and 1C show the electromagnetic relay 1 with a cover removed so as to clearly illustrate the internal structure of the electromagnetic relay 1. FIG. 1B does not show several major components of the electromagnetic relay 1, such as an electromagnet including a coil, an iron core, a bobbin, coil terminals, etc., as well as an armature, a force transfer member, etc., for the sake of clarity. FIG. 1C shows the assembly 100 with the electromagnetic relay 1 mounted on the circuit board 30.

As shown in FIGS. 1A to 1C, the electromagnetic relay 1 includes a holder 10 to which various components are attached by, e.g., press-fitting, and a cover 20 attached to the holder 10 so as to enclose the holder 10 and the various components. FIG. 1B clearly shows that the holder 10 is provided with a coil housing section 15 accommodating a coil, etc. (not shown), and a movable contact member 17 and a stationary contact member 18 are attached to and supported on the holder 10. The electromagnetic relay 1 is provided with a body 25 constructed by combining the cover 20 with the holder 10 and having a substantially rectangular parallelepiped shape with four lateral surfaces 26, one bottom surface 27, and one top surface 28, intersecting at generally right angle with each other. The holder 10 and the cover 20 cooperate with each other to define the interior space of the body.

The movable contact member 17 is made of a plate-like material and provided with a fitting section 17a adapted to be fitted in and fixed to a groove 11 formed in the lower portion of the holder 10 as shown in FIG. 1B. The movable contact member 17 is also provided with, adjacent to the fitting section 17a, a first end section 17b extending upward in FIG. 1B and a second end section 17c opposite to the first end section 17b and extending downward in FIG. 1B.

The first end section 17b extends in the interior space of the body 25 and is configured to be elastically displaceable in a thickness direction of the plate-like material under driving force transferred from the electromagnet (not shown), which is due to magnetic force generated by the coil (not shown). A movable contact 17d is securely carried on or attached to the first end section 17b and protrudes in the thickness direction from the surface of the first end section 17b toward the stationary contact member 18. The armature (not shown) adapted to be displaced by magnetic attracting force of the coil and the force transfer member (not shown) adapted to transfer the displacement of the armature to the movable contact member 17 may have any known configurations.

The second end section 17c extends so as to protrude outward from one of the lateral surfaces 26 of the rectangular parallelepiped body 25 (i.e., an outer surface of the holder 10), and a portion of the second end section 17c extending outside the body 25 constitutes a terminal 7 for external connection. The movable contact member 17 may be formed by stamping out a sheet metal material into a desired profile and bending the stamped piece in the thickness direction thereof (i.e., a rightward/leftward direction in FIG. 1B), so as to provide the fitting section 17a, the first end section 17b, and the second end section 17c including the terminal 7, with a predetermined shape.

Thus, in the assembly 100, the terminal 7 of the movable contact member 17 is formed from a flat plate element, and is oriented such that the thickness direction of the flat plate element corresponds to a horizontal direction relative to the circuit board 30 and the width direction of the flat plate element, perpendicular to the thickness direction, corresponds to a vertical direction relative to the circuit board 30. Further, in the assembly 100, the first end section 17b of the movable contact member 17 extends generally perpendicular to the width direction of the flat plate element of the terminal 7. The thickness direction of the entire movable contact member 17 corresponds to the thickness direction of the flat plate element of the terminal 7.

The stationary contact member 18 is made of a plate-like material and provided with a fitting section 18a adapted to be fitted in and fixed to a groove 12 formed in the lower portion of the holder 10 as shown in FIG. 1B. The stationary contact member 18 is also provided with, adjacent to the fitting section 18a, a first end section 18b extending upward in FIG. 1B and a second end section 18c opposite to the first end section 18b and extending downward in FIG. 1B.

The first end section 18b extends in the interior space of the body 25. A stationary contact 18d is securely carried on or attached to the first end section 18b at a position corresponding to the movable contact 17d of the movable contact member 17, and protrudes in a thickness direction of the plate-like material from the surface of the first end section 18b toward the movable contact member 17.

The second end section 18c extends so as to protrude outward from the lateral surface 26 of the rectangular parallelepiped body 25 (i.e., an outer surface of the holder 10), and a portion of the second end section 18c extending outside the body 25 constitutes a terminal 8 for external connection. The stationary contact member 18 may be formed by stamping out a sheet metal material into a desired profile and bending the stamped piece in the thickness direction thereof (i.e., a rightward/leftward direction in FIG. 1B), so as to provide the fitting section 18a, the first end section 18b, and the second end section 18c including the terminal 8, with a predetermined shape.

Thus, in the assembly 100, the terminal 8 of the stationary contact member 18 is formed from a flat plate element, and is oriented such that the thickness direction of the flat plate element corresponds to a horizontal direction relative to the circuit board 30 and the width direction of the flat plate element, perpendicular to the thickness direction, corresponds to a vertical direction relative to the circuit board 30. Further, in the assembly 100, the first end section 18b of the stationary contact member 18 extends generally perpendicular to the width direction of the flat plate element of the terminal 8. The thickness direction of the entire stationary contact member 18 corresponds to the thickness direction of the flat plate element of the terminal 8.

In the electromagnetic relay 1, in order to ensure the sufficient amount of displacement of the first end section 17b carrying the movable contact 17d without unduly increasing the magnetic force generated by the coil and required to cause the displacement, it is preferable to increase the length of the first end section 17b to some extent. Further, when the movable contact member 17 and the stationary contact member 18 are electrically disconnected from each other, it is preferable to ensure a desired distance therebetween for reliable electrical disconnection. Consequently, the dimensions of the electromagnetic relay 1 may increase, particularly, in the longitudinal and thickness directions of the displaceable first end section 17b of the movable contact member 17. On the other hand, the dimension of the electromagnetic relay 1 in a direction perpendicular to the longitudinal and thickness directions of the first end section 17b can be relatively easily reduced.

As a result, the electromagnetic relay 1 has dimensions relatively large in upward/downward and rightward/leftward directions in FIG. 1B (i.e., the horizontal direction relative to the circuit board 30), and has a dimension relatively small in a direction perpendicular to the upward/downward and rightward/leftward directions in FIG. 1B (i.e., the vertical direction relative to the circuit board 30). The thickness direction of each terminal 7, 8 is oriented in parallel to the longitudinal direction of the rectangular lateral surface 26 of the body 25, from which the terminals 7 and 8 protrude.

Each terminal 7, 8 is provided with a proximal portion 7a, 8a adjacent to and extending perpendicularly from the lateral surface 26 of the body 25, from which the terminals 7 and 8 protrude, an intermediate portion 7b, 8b adjacent to and extending perpendicularly from the proximal portion 7a, 8a and parallel to the lateral surface 26, and a distal portion 7c, 8c adjacent to and extending straight from the intermediate portion 7b, 8b and beyond the bottom surface 27 of the rectangular parallelepiped body 25 (i.e., an outer surface of the cover 20). Thus, each terminal 7, 8 has a shape angled in the width direction of the flat plate element, and more specifically, an L-shape in the illustrated embodiment.

The electromagnetic relay 1 further includes a pair of coil terminals 5 and 6 connected respectively to the wire ends of the coil. The coil terminals 5 and 6 are supported on the holder 10 and protrude outward from the lateral surface 26 of the body 25, from which the terminals 7 and 8 protrude. Although the sections of the coil terminals 5 and 6 extending in the interior space of the body 25 are not shown, the coil terminals 5 and 6 can be fitted in and fixed to grooves formed in the lower portion of the holder 10.

Each of the coil terminals 5 and 6 has a configuration substantially corresponding to that each terminal 7, 8 of the movable or stationary contact member 17, 18. Thus, each coil terminal 5, 6 is formed from a flat plate element, and is oriented such that the thickness direction of the flat plate element corresponds to a horizontal direction relative to the circuit board 30 and the width direction of the flat plate element, perpendicular to the thickness direction, corresponds to a vertical direction relative to the circuit board 30.

More specifically, the thickness direction of each coil terminal 5, 6 is oriented in parallel to the longitudinal direction of the rectangular lateral surface 26 of the body 25, from which the coil terminals 5 and 6 protrude. Also, each coil terminal 5, 6 is provided with a proximal portion 5a, 6a adjacent to and extending perpendicularly from the lateral surface 26 of the body 25, from which the coil terminals 5 and 6 protrude, an intermediate portion 5b, 6b adjacent to and extending perpendicularly from the proximal portion 5a, 6a and parallel to the lateral surface 26, and a distal portion 5c, 6c adjacent to and extending straight from the intermediate portion 5b, 6b and beyond the bottom surface 27 of the rectangular parallelepiped body 25. Thus, each coil terminal 5, 6 has a shape angled in the width direction of the flat plate element, and more specifically, an L-shape in the illustrated embodiment.

The rectangular parallelepiped body 25 of the electromagnetic relay 1 is configured such that the shorter edge 26a of the lateral surface 26 is shorter than any of edges 27a, 27b of the bottom surface 27. In other words, the edge 26a of the lateral surface 26 is shortest in all of the edges extending orthogonal to each other to constitute the rectangular parallelepiped, and the body 25 is thinner in the direction of the shortest edge 26a. Thus, the terminals 5, 6, 7, 8 protrude perpendicularly from the lateral surface 26 of the body 25 and extend, at the intermediate and distal portions 5b, 6b, 7b, 8b, 5c, 6c, 7c, 8c thereof, in a direction parallel to the shortest edge 26a of the body 25.

In the illustrated embodiment, the distal portions 5c, 6c, 7c, 8c of the terminals 5, 6, 7, 8 extend beyond the bottom surface 27 of the body 25 to an extent identical to each other. Further, the terminals 5, 6, 7, 8 extend parallel to each other, and the distal portions 5c, 6c, 7c, 8c of the terminals 5, 6, 7, 8 are disposed in an array parallel to the lateral surface 26 of the body 25. These configurations serve to make the electromagnetic relay 1 compact and easy-to-use, but are not limitative in the present invention.

As shown in FIGS. 1A and 1C, the circuit board 30 is provided with a relay-mount surface 31 as a generally flat major surface, and a plurality (four, in the drawing) of through holes 32 opening in the relay-mount surface 31 and penetrating through the thickness of the circuit board 30.

In the assembly 100, the electromagnetic relay 1 is mounted on the relay-mount surface 31 of the circuit board 30 in an orientation such that the bottom surface 27 of the body 25 is opposed to the relay-mount surface 31, and that the intermediate and distal portions 5b, 6b, 7b, 8b, 5c, 6c, 7c, 8c of the terminals 5, 6, 7, 8 extend orthogonally to the relay-mount surface 31. In this mounting configuration, the distal portions 5c, 6c, 7c, 8c of the terminals 5, 6, 7, 8 are inserted respectively into the through holes 32 and fixed to the circuit board 30.

When the electromagnetic relay 1 is appropriately mounted on the circuit board 30, the shortest edge 26a of the body 25 is oriented to extend orthogonal to the relay-mount surface 31. As a result, the body 25 is provided with a reduced height defined in a direction orthogonal to the relay-mount surface 31 of the circuit board 30, and thus corresponding to a length of a shortest edge of the lateral surface. Therefore, the electromagnetic relay 1 mounted on the circuit board 30 exhibits a low-profile configuration relative to the circuit board 30.

As described above, according to the assembly 100 of this embodiment, the electromagnetic relay 1 can be provided with a low-profile configuration. In this connection, each of the terminals 5, 6, 7, 8 for external connection has a shape angled in the width direction of the flat plate element, not in the thickness direction. Therefore, each terminal 5, 6, 7, 8 can be formed by a simple pressing process, e.g., by stamping out a sheet metal material into a predetermined angled shape (or an L-shape), without bending the stamped piece. Therefore, in contrast to the conventional low-profile configuration shown in FIG. 3, it is not necessary, in the assembly 100, to bend any terminals to provide a low-profile configuration, and thus additional cost due to the bending process is eliminated. Further, in spite of the angled shape, the strength of each terminal 5, 6, 7, 8 can be increased, and thus the stability of the electromagnetic relay 1 mounted on the circuit board 30 can be improved.

Further, the electromagnetic relay 1 can be modified from the low-profile configuration to a thinner and higher configuration capable of reducing a mounting area for the electromagnetic relay in the surface of the circuit board, by simply changing the terminals 5, 6, 7, 8 having the angled shape to other terminals having a straight shape. Therefore, it is possible to produce a low-profile electromagnetic relay 1 and a thinner of high-profile electromagnetic relay by using many common components, other than terminals (and contact members), and as a result, there is an advantage that two types of electromagnetic relays can be efficiently manufactured.

Further, in the illustrated embodiment, the low-profile configuration of the electromagnetic relay 1 is achieved by orienting the rectangular parallelepiped body 25 so that the shortest edge 26a of the lateral surface 26 extends orthogonal to the relay-mount surface 31 of the circuit board 30. According to this configuration, the height of the electromagnetic relay 1 can be easily reduced to a greater extent in comparison with a conventional electromagnetic relay described in JP2002-184286A, in which a low-profile configuration is achieved by merely changing a straight terminal to an angled terminal without changing the mounting orientation of the electromagnetic relay. Thus, according to the assembly 100, it is possible to reduce an overall height of the electromagnetic relay 1 mounted on the circuit board 30 by a significantly simple and reasonable configuration.

It should be noted that the above illustrated embodiment is not limitative, but various changes can be made thereto.

For example, the number of the terminals for external connection is not limited to "four" as in the illustrated embodiment. Two stationary contacts, one of which is so-called "make contact" adapted to be disconnected from a movable contact when a coil is not excited and connected to the movable contact when the coil is excited, and the other of which is so-called "break contact" adapted to be connected to a movable contact when a coil is not excited and disconnected from the movable contact when the coil is excited. Further, a plurality of the make contacts and/or the break contacts may be provided. Still further, the electromagnetic relay may be provided with two coils and each coil may have respective two coil terminals.

The shape of the body 25 is not limited to the illustrated accurate rectangular parallelepiped, but may be a roughly rectangular parallelepiped. The present invention can also be applied to an electromagnetic relay having a polyhedron body other than the rectangular parallelepiped. The shape of each terminal 5, 6, 7, 8 is not limited to the illustrated L-shape, but may be a variously angled shape other than the L-shape.

While the invention has been described with reference to specific preferred embodiments, it will be understood by those skilled in the art that various changes and modifications may be made thereto without departing from the scope of the following claims.

The invention claimed is:

1. An assembly comprising:
an electromagnetic relay including a body having a rectangular lateral surface and a bottom surface, and a plurality of terminals protruding outward from said lateral surface of said body, said plurality of terminals respectively having distal portions extending beyond said bottom surface of said body, said plurality of terminals each having a thickness and a width such that each respective width is greater than each respective thickness, the width of the terminals being measured in a direction perpendicular to the lateral surface and the thickness of the terminals being measured in a direction parallel to the lateral surface; and
a circuit board provided with a relay-mount surface, said electromagnetic relay being mounted on said relay-mount surface in an orientation such that said bottom surface of said body is opposed to said relay-mount surface, and said distal portions of said plurality of terminals being fixed to said circuit board;
wherein each of said plurality of terminals is formed from a flat plate element and has a shape angled in a width direction of said flat plate element, the width direction of said flat plate element being oriented perpendicular to said rectangular lateral surface of said body; and
wherein said body has a height defined in a direction orthogonal to said relay-mount surface of said circuit board and corresponding to a length of a shortest edge of said lateral surface, said shortest edge being shorter than any of edges of said bottom surface.

2. The assembly of claim 1, wherein said body includes a holder and a cover attached to said holder and defining an interior space of said body; and wherein said electromagnetic relay further includes a contact member supported on said body, said contact member being provided with a first end section extending in said interior space and a second end section opposite to said first end section and extending outside said body, said second end section comprising one of said plurality of terminals, and said first end section extending generally perpendicular to said width direction of said flat plate element.

3. The assembly of claim 1, wherein said distal portions of said plurality of terminals extend beyond said bottom surface of said body to an extent identical to each other.

4. The assembly of claim 1, wherein said plurality of terminals extend parallel to each other; and wherein said distal portions of said plurality of terminals are disposed in an array parallel to said lateral surface of said body.

5. The assembly of claim 1, wherein said circuit board is provided with a plurality of through holes opening in said relay-mount surface; and wherein said distal portions of said plurality of terminals are inserted respectively into said plurality of through holes.

* * * * *